US 6,579,360 B2

(12) United States Patent
Balachandran et al.

(10) Patent No.: US 6,579,360 B2
(45) Date of Patent: Jun. 17, 2003

(54) FABRICATION OF HIGH TEMPERATURE SUPERCONDUCTORS

(75) Inventors: Uthamalingam Balachandran, Hinsdale, IL (US); Stephen E. Dorris, LaGrange Park, IL (US); Beihai Ma, Downers Grove, IL (US); Meiya Li, Woodridge, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 09/905,509

(22) Filed: Jul. 13, 2001

(65) Prior Publication Data

US 2003/0013613 A1 Jan. 16, 2003

(51) Int. Cl.$^7$ ............................................... C30B 25/02
(52) U.S. Cl. .............................. 117/95; 117/81; 117/84; 117/107
(58) Field of Search .............................. 117/84, 87, 95, 117/104

(56) References Cited

U.S. PATENT DOCUMENTS

| | | | |
|---|---|---|---|
| 5,422,151 A | * | 6/1995 | Weder et al. ................ 428/350 |
| 5,611,854 A | | 3/1997 | Veal et al. |
| 5,739,086 A | * | 4/1998 | Goyal et al. ................ 505/473 |
| 5,869,431 A | | 2/1999 | Veal et al. |
| 5,958,599 A | * | 9/1999 | Goyal et al. ................ 428/457 |
| 6,188,921 B1 | | 2/2001 | Otto et al. |

OTHER PUBLICATIONS

Nature vol. 47, Sep. 14, 2000.

* cited by examiner

Primary Examiner—Felisa Hiteshew
(74) Attorney, Agent, or Firm—Emrich and Dithmar

(57) ABSTRACT

A method of forming a biaxially aligned superconductor on a non-biaxially aligned substrate substantially chemically inert to the biaxially aligned superconductor comprising is disclosed. A non-biaxially aligned substrate chemically inert to the superconductor is provided and a biaxially aligned superconductor material is deposited directly on the non-biaxially aligned substrate. A method forming a plume of superconductor material and contacting the plume and the non-biaxially aligned substrate at an angle greater than 0° and less than 90° to deposit a biaxially aligned superconductor on the non-biaxially aligned substrate is also disclosed. Various superconductors and substrates are illustrated.

27 Claims, 4 Drawing Sheets

FABRICATION OF HIGH TEMPERATURE SUPERCONDUCTORS

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

FIELD OF THE INVENTION

The present invention relates to a method that greatly simplifies the fabrication of superconductor coated substrates by directly depositing a biaxially aligned superconductor onto a nonbiaxially aligned substrate.

BACKGROUND OF THE INVENTION

These inventions relate to improved technology for making so-called "second generation" second generation high temperature superconductors. Research efforts around the world have shifted away from the powder in tube (BSCCO) technology to development of YBCO coated conductors. The reason for this shift is because YBCO superconductors possess greatly enhanced critical current densities while at the same time exhibiting lower degradation in the presence of external magnetic fields.

Other researchers have found that enhancement of $J_C$ can be obtained by selectively doping the grain boundaries of YBCO superconductors with calcium. These investigators fabricated multilayer structures of YBCO and YBCO with calcium on $SrTiO_3$ bicrystals with [001] tilt angle of 24 degrees (i.e. the misorientation angle). The result showed that the Ca-doped YBCO grain boundaries can have a very high $J_C$ even if the grain boundary misorientation angle is as great as 24 degrees, see "*Enhanced Supercurrent Density in Polycrystalline High $T_C$ Superconductors at 77K*" by G. Hammerl et al. that appeared in the Sep. 12, 2000 issue of Journal Nature.

Most current research efforts are focused on using nickel or nickel alloys as a flexible substrate. These substrates, however, must first be coated with cerium oxide. The layering is necessary to provide the desired lattice matching and to prevent diffusion of the nickel from the substrate into the biaxially textured superconducting layer. One method being utilized to fabricate these textured substrates is the RABiTS (Rolling Assisted Biaxially Textured Substrate) process developed at Oak Ridge National Laboratory. IBAD (ion-Beam Assisted Deposition) developed at Los Alamos National Laboratory, and ISD (Inclined Substrate Deposition) developed at Argonne National Laboratory are processes used to deposit a biaxially textured oxide layer on an untextured substrate. The essential step in each of these methods is fabrication of a textured substrate, i.e., a substrate whose individual grains are extremely well aligned in two orthogonal directions. On top of the textured substrate, before YBCO can be deposited, other non-superconducting layers must be grown to provide a better match with YBCO properties such as lattice spacing and thermal expansion and to minimize reaction between YBCO and the substrate. Deposition of each layer requires precise control of the process, increases the time and cost associated with fabrication of the conductor, and increases the chance that flaws will develop.

SUMMARY OF THE INVENTION

Various methods heretofore described, the RABiTS, IBAD and ISD methods of forming second generation high temperature superconductors, all have draw backs, mostly related to the number of layers which need to be deposited and the associated amount of time necessary to produce them. What is needed is a method of producing second generation superconductors which can use the speed inherent in the ISD method without the need to form intermediate layers.

Accordingly, it is an object of the present invention to provide a method for rapidly producing second generation superconductors in which a biaxially aligned superconductor layer is directly deposited on a non-biaxially textured substrate which is compatible with the superconductor and substantially chemically inert with respect thereto. It is preferred that atoms of the substrate do not migrate into the superconductor.

Another object of the invention is to provide a method for directly depositing a biaxially aligned superconductor on a substrate which may be untextured or axially textured.

Yet another object of the present invention is to establish a plume of superconductor material and directly deposit the superconductor material on an untextured metal substrate using the ISD method, wherein the metal substrate is chemically substantially inert to the superconductor.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

A variety of methods are available for use in the present invention. For instance non ionic deposition methods such as metal organic chemical vapor deposition (MOCVD) which does not create superconducting ions may be used to deposit superconducting material on a suitable substrate. The preferred method employs a pulsed laser to produce a plume of superconductor material in a modified inclined substrate method illustrated in FIG. 2.

Figure 1:
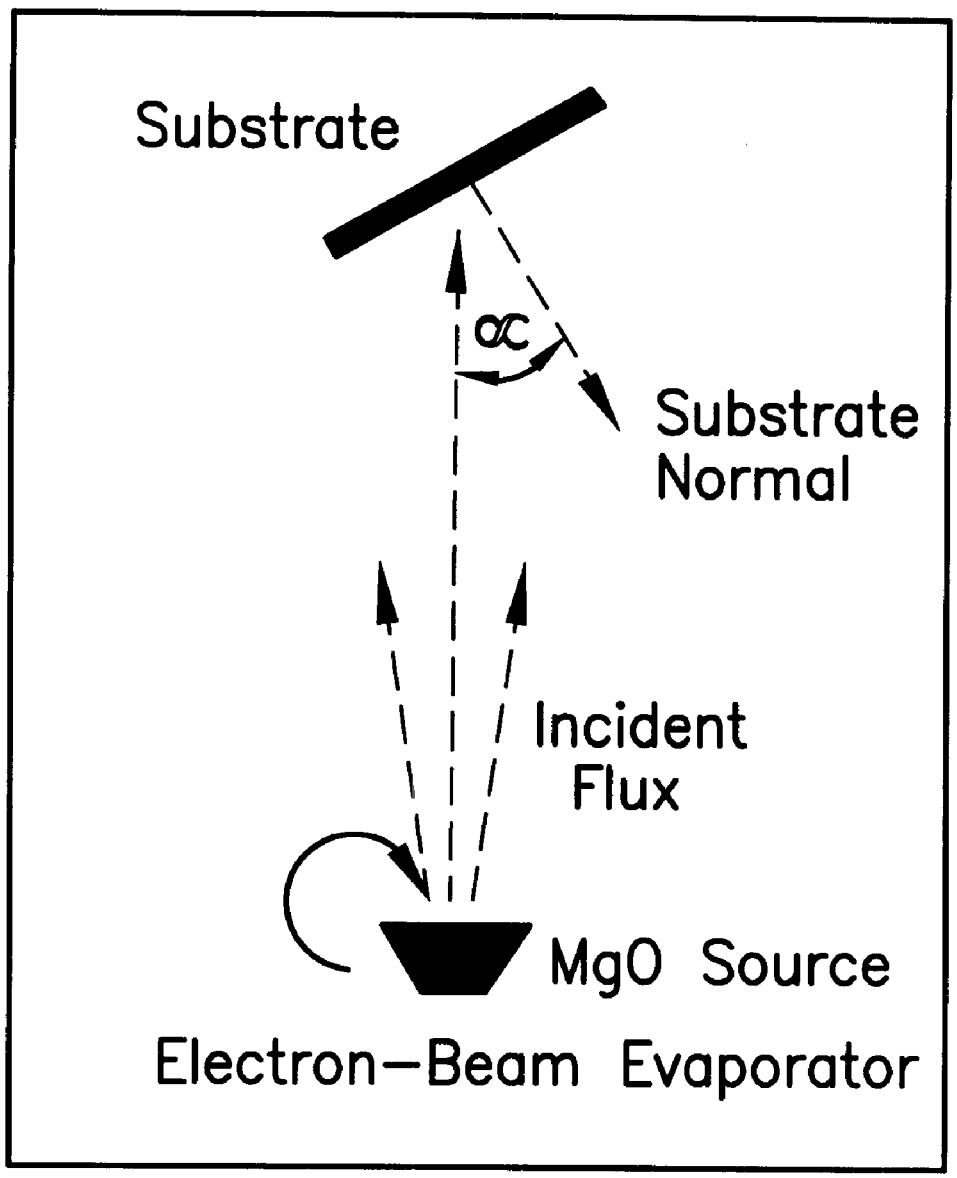
FIG. 1 is a schematic illustration of the inclined substrate deposition method previously used.

Referring now to FIG. 1 of the drawings, there is illustrated a schematic illustration of the prior art inclined substrate method. In the prior art inclined substrate method, a substrate is positioned at an angle α to a plume of flux from an oxide source thereof. As illustrated in FIG. 1, an electron beam evaporator or other suitable and well known plume-producing technique is used to create a plume of incident flux which travels toward a substrate. The angle α is defined as the angle between the line normal to the plane of the substrate and a line perpendicular to the surface of the oxide source. It should be understood that the oxide source may not be a planar surface but the defined angle α is referenced to an assumed plane if the oxide surface is, for instance, small chunks of material. Preferably, for the present invention, if the inclined substrate deposition method is employed, the angle of α is maintained at an angle greater than 0° and less than 90°. Preferably, the angle α is in the range of from about 20° to about 70° and most preferably about 50–65°. In order to practice the invention in a commercially viable manner, the production of the superconductor must involve relative movement between the source of the superconductor material and the substrate, most likely with the substrate being moved past a source of superconductor material. Prior to the invention of Balachandran and Chudzik disclosed in Ser. No. 09/621,272 filed Jul. 20, 2000, the entire specification thereof being incorporated herein by reference, it was not possible for biaxially textured oxide coatings, such as magnesium oxide, to be deposited on moving substrates because the plume of oxide atoms, produced for instance by electron beam evaporation, diverged as the plume left the source of the oxide and moved toward the substrate. As the plume diverges, the angles at which the oxide atoms contact the moving substrate change until a substantial percentage of the oxide atoms are outside the angular range which results in a biaxially textured deposition. Balachandran and Chudzik in the aforementioned application, disclose a method useful to deposit biaxially textured oxide coatings on moving substrates.

While the Balachandran and Chudzik application previously referenced, envisions at least a three layer construction, that is a substrate layer, a textured oxide layer and a superconductor layer on top of the textured oxide layer, the method here disclosed is capable of laying down a biaxially aligned superconductor oxide layer directly on an untextured or axially texture substrate, which is the subject matter of the present invention. The present invention resides in the discovery that by selectively choosing the substrate to be a material which does not interact with the superconductor, the substrate does not have to be biaxially textured nor do multiple layers have to deposited. Rather, by using a substrate which preferably may be made from a silver or silver alloy, a gold or gold alloy, or a platinum or platinum alloy, the biaxially aligned superconductor can be laid down directly on top of the substrate without the requirement of the many layers previously used in all the above-referenced processes.

Figure 2:
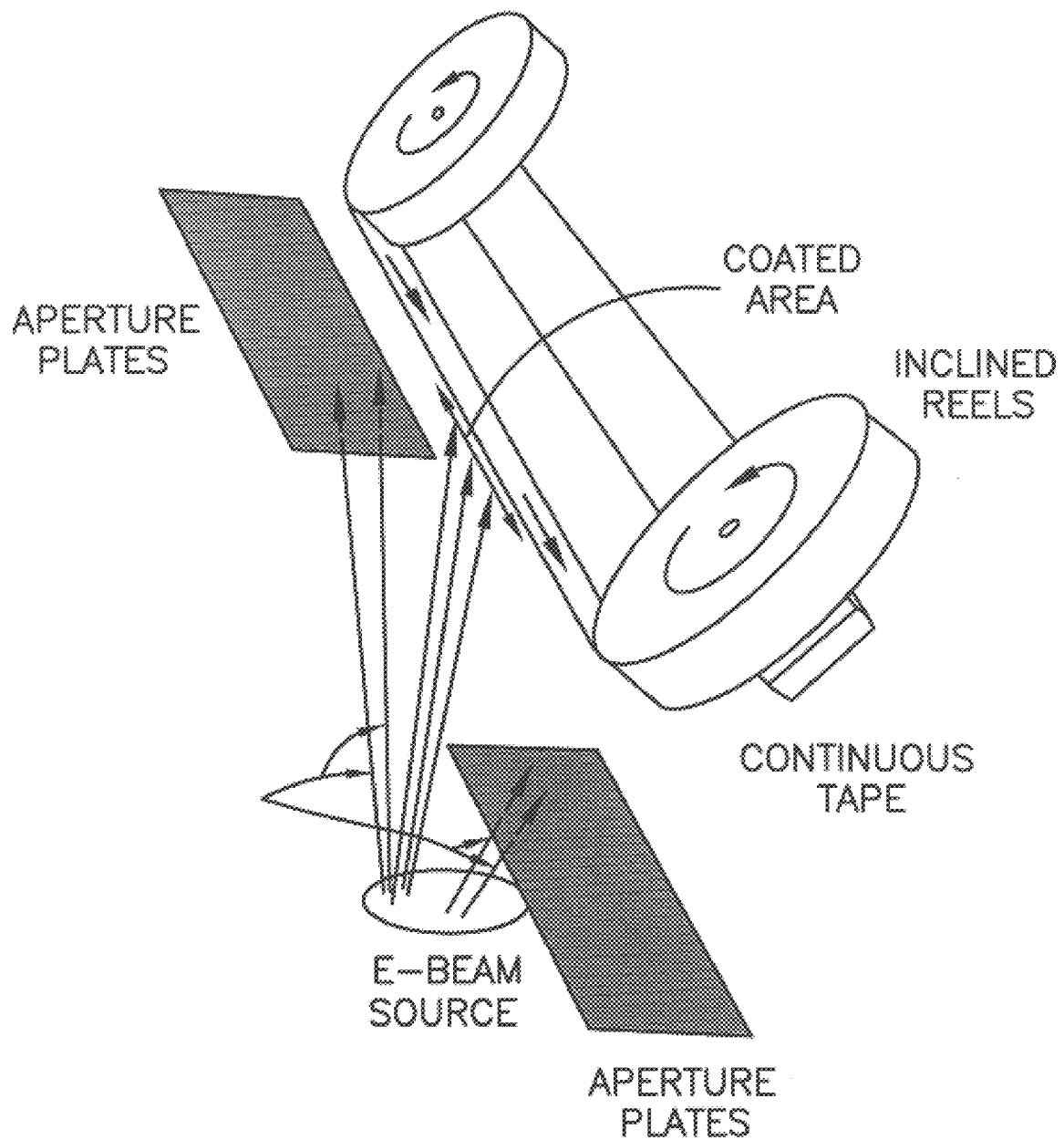
FIG. 2 is a schematic illustration of the inclined substrate deposition method which may be used with the present invention.

One such method of directly laying down a biaxially aligned superconducting material directly onto a suitable substrate is to provide a device as illustrated in FIG. 2 thereof.

In order to limit the angles at which superconductor atoms in a plume strike the substrate, a device as illustrated in FIG. 2 may be used. In such a device, there is a source of substrate material indicated by the left hand circular supply and a take-up storage device indicated by the right hand reel. These reels are inclined at an angle with respect to the surface of the superconductor source. Superconductor plumes are produced by means of a variety of well known methods, evaporation being but one, pulsed laser being another. An electron beam evaporator may be used in order to vaporize the superconducting oxide atoms from a source thereof and an apertured plate or collimator may be disposed between the source of oxide atoms and the moving substrate. By using an apertured plate or collimator having an opening therein of about 2" in diameter, the angle at which the superconductor atoms strike the substrate can be limited to ±5° while a preselected angle within the preferred range of from about 20° to about 70°, it being understood that an angle greater than 0° and less than 90° will suffice. The most preferred angles within the above selected range of angles is between about 50° and about 65°.

Suitable substrates, as hereinbefore stated, are any materials which do not adversely react with the superconductor laid down. Suitable substrates may be various ceramics as well as metals or alloys. The preferred metal is silver or its alloys, it being understood that other metals such as gold and alloys thereof or platinum or alloys thereof may be used, but silver and its alloys, at present, are the preferred substrates. A variety of superconducting materials may be used as the source of oxide atoms or ions. For example, there may be included elements, salts, or oxides of copper, yttrium, and barium for the YBCO family of oxide superconductors. Elements or oxides of copper, bismuth, strontium and calcium and optionally lead for the BSCCO family of oxide superconductors; elements, salts or oxides of copper, thallium, calcium and barium or strontium, and optionally bismuth and lead, for the thallium (TBSCCO) family of oxide superconductors; elements, salts, or oxides of copper, mercury, calcium, barium or strontium and optionally bismuth and lead, for the mercury (HBSCCO) family of oxide superconductors.

Moreover, new superconductors, such as $MgB_2$ may be used. The YBCO family of oxide superconductors is considered to include all oxide superconductors of the type comprising barium, copper, and a rare earth selected from the group consisting of yttrium, lanthanum, neodymium, samarium, europium, gadolinium, terbium, dysprosium, holmium, erbium, thulium, ytterbium, and lutetium. The formation of an intermediate may be desired in order to take advantage of desirable processing properties. It is intended to cover herein precursors in amounts sufficient to form any biaxially aligned (textured) superconductor. In some embodiments, the precursor powders may be provided in substantially stoichiometric portions. In others, there may be a stoichiometric excess or deficiency of any precursor to accommodate the processing conditions used to form the desired superconducting composite. The invention also includes doping with various elements such as calcium and the term "superconductor" is intended to cover precursors along with dopant quantities of other materials.

Figure 3:
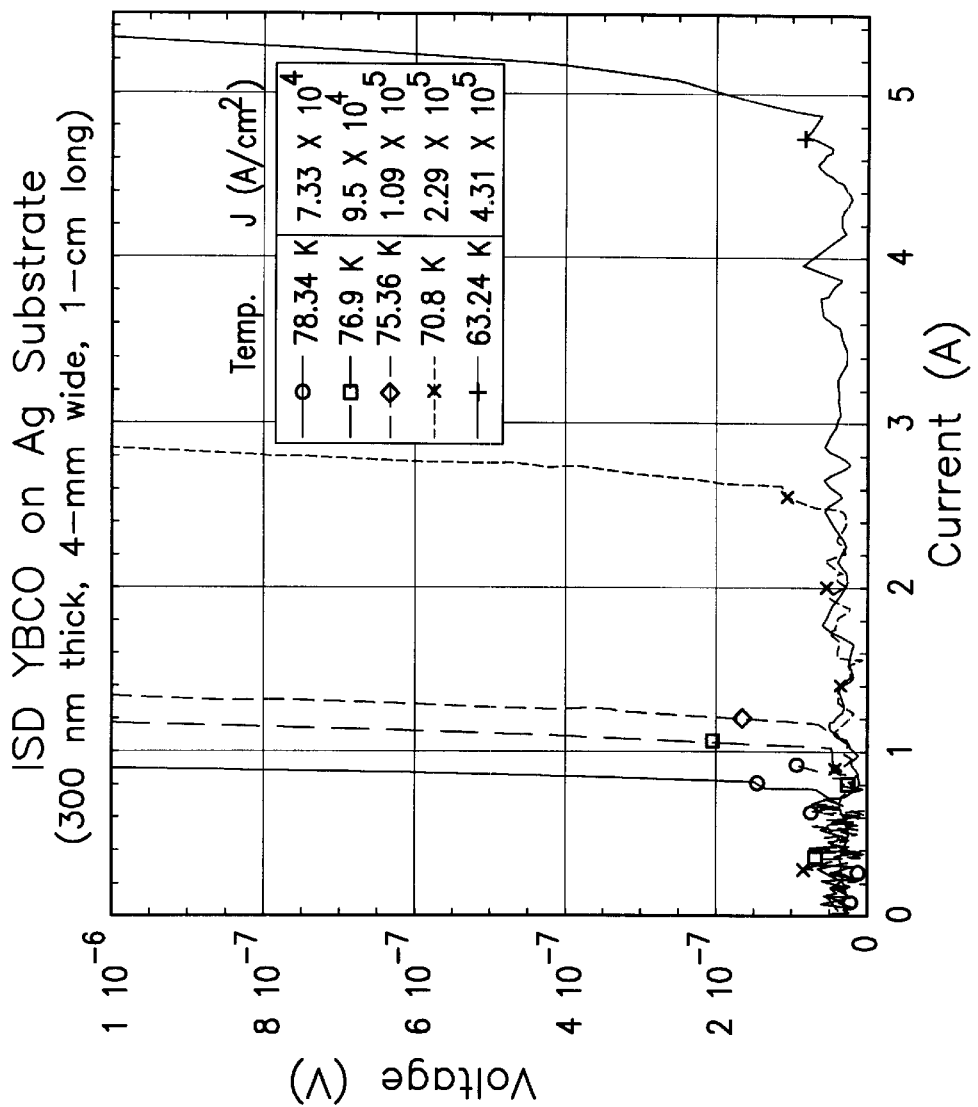
FIG. 3 is a graphical representation of the relationship between voltage and critical current at 77° K for a biaxially aligned YBCO superconductor 300 nm thick, 4-mm wide and 1-cm long laid down by the ISD process directly on an untextured silver substrate.
Figure 4:
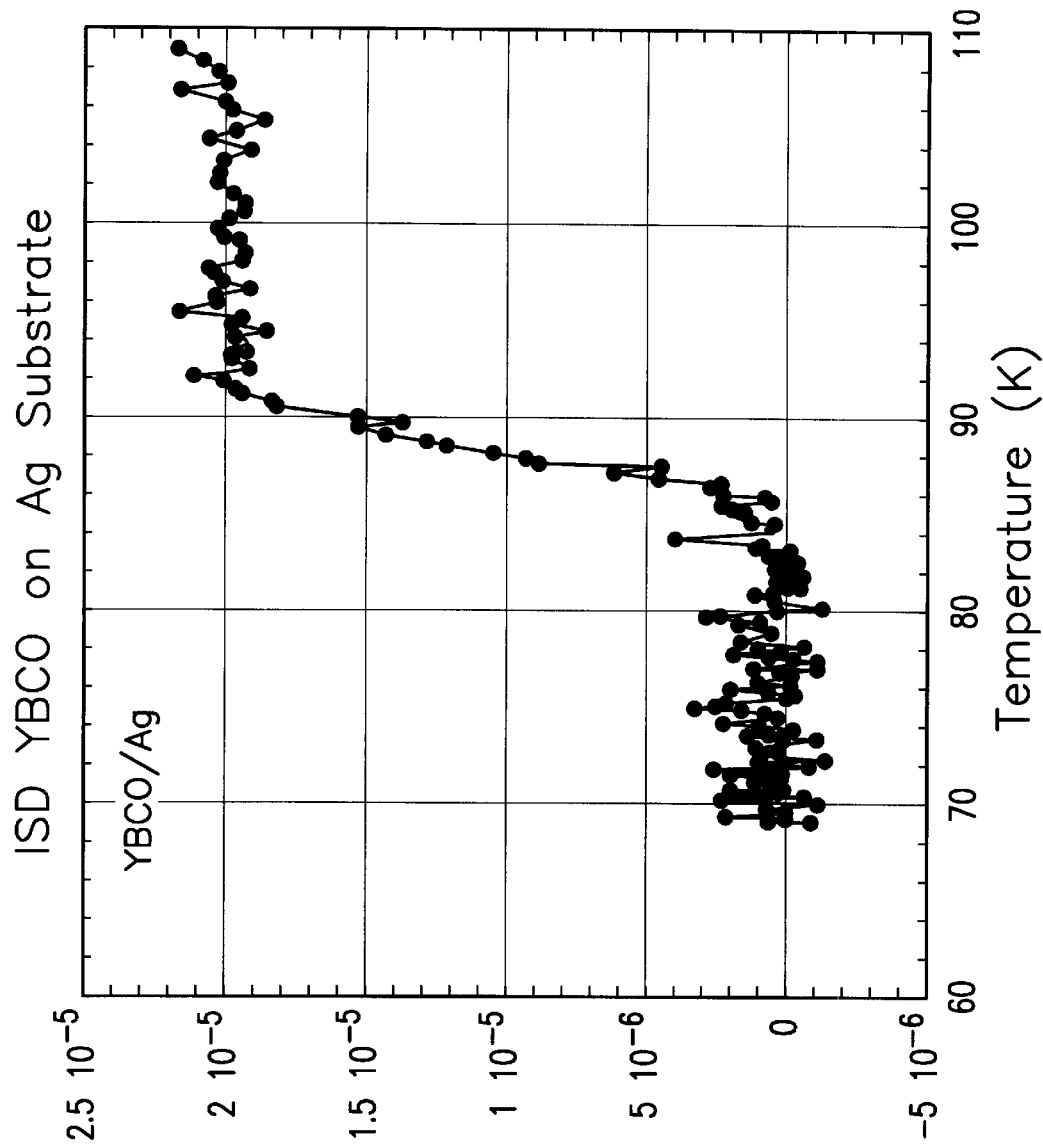
FIG. 4 is a graphical representation of relationship between the voltage and the critical temperatures for a biaxially aligned YBCO superconductor laid down on an untextured silver substrate using the ISD method.

Referring to FIGS. 3 and 4, the figures show the measured parameters of samples which were prepared by Pulsed Laser Deposition of YBCO on a silver substrate which was held at an inclination of an angle of about 53° at a temperature of approximately 740–780° C. Temperatures of from 700° to about 800° are suitable, it being understood that YBCO atoms must have sufficient energy to biaxially align themselves upon deposition. The films made were 300 nanometers thick by 4 mm wide by 1 cm long, see FIG. 4. The critical currents illustrated in FIG. 3 were determined by transport measurements that were made by the four-probe method. At 77K, the critical current density was just below 100,000 $A/cm^2$; although other methods produce samples with higher critical current densities, the present invention has the significant advantages of much greater fabrication speed and much simpler architecture. That is, multiple layers are not required. The critical temperature shown in FIG. 4 was measured inductively by a 2-coil method. Although the above discussed examples relate to only a few different samples prepared in accordance with the process of the present invention, it will be understood by those of ordinary skill in this art that a wide variety of deposition methods may be used without departing from the teaching of the present invention. Moreover, it is also understood by one of ordinary skill in this art that a wide variety of substrates may be used and that the deposition parameters may vary also.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of forming a biaxially aligned superconductor on a non-biaxially aligned substrate substantially chemically inert to the biaxially aligned superconductor comprising: providing a non-biaxially aligned substrate chemically inert to the superconductor, and depositing a biaxially aligned superconductor material directly on the non-biaxially aligned substrate.

2. The method of claim 1, wherein the substrate is a metal or alloy selected from the group consisting of Ag, Ag alloys, Au, Au alloys, Pt and Pt alloys.

3. The method of claim 2, wherein the biaxially aligned superconductor is deposited by ablation or by vapor deposition.

4. The method of claim 2, wherein the biaxially aligned superconductor comprises a member of YBCO family of oxide superconductors.

5. The method of claim 4, wherein YBCO oxide superconductor is doped with Ca.

6. The method of claim 1, wherein the substrate is randomly oriented.

7. A method of depositing a biaxially aligned superconductor on a non-biaxially aligned substrate substantially chemically inert to the biaxially aligned superconductor comprising: forming a plume of superconductor material, providing a non-biaxially aligned substrate chemically inert to the superconductor, and contacting the plume and the non-biaxially aligned substrate at an angle greater than 0° and less than 90° to deposit a biaxially aligned superconductor on the non-biaxially aligned substrate.

8. The method of claim 7, wherein the biaxially aligned superconductor comprises a member of the YBCO family of oxide superconductors.

9. The method of claim 7, wherein the biaxially aligned superconductor comprises BSCCO 2223 phase.

10. The method of claim 7, wherein the biaxially aligned superconductor comprises BSCCO 2212 phase.

11. The method of claim 7, wherein the biaxially aligned superconductor comprises a member of the TBSCCO family of oxide superconductors.

12. The method of claim 7, wherein the biaxially aligned superconductor comprises a member of the HBSCCO family of oxide superconductors.

13. The method of claim 7, wherein the non-biaxially aligned substrate is a metal or alloy.

14. The method of claim 13, wherein substrate is one or more of Ag, Ag alloys, Au, Au alloys, Pt and Pt alloys.

15. The method of claim 14, wherein the substrate is randomly oriented.

16. The method of claim 14, wherein the substrate is maintained at a temperature greater than about 700° C.

17. The method of claim 16, wherein the substrate is maintained at a temperature in the range of from about 720° C. to about 800° C.

18. A method of depositing a biaxially aligned superconductor on a non-biaxially aligned metal or alloy substrate substantially chemically inert to the biaxially aligned superconductor comprising: forming a plume of superconductor material, providing a non-biaxially aligned metal or alloy substrate substantially chemically inert to the superconductor, and contacting the plume directly with the surface of the non-biaxially aligned metal or alloy substrate at an angle greater than 0° and less than 90° to deposit a biaxially aligned superconductor on the non-biaxially aligned metal or alloy substrate.

19. The method of claim 18, wherein the biaxially aligned superconductor comprises a member of YBCO family of oxide superconductors.

20. The method of claim 19, wherein YBCO oxide superconductor is doped with Ca.

21. The method of claim 20, wherein the metal or alloy substrate is one or more of Ag, Ag alloys, Au, Au alloys, Pt and Pt alloys.

22. The method of claim 21, wherein the substrate is maintained at a temperature greater than about 700° C.

23. The method of claim 18, wherein the metal or alloy substrate is randomly oriented.

24. The method of claim 22, wherein the substrate is maintained at a temperature in the range of from about 720° C. to about 800° C.

25. The method of claim 24, wherein the angle between the plume and the substrate is in the range of from about 20° to about 70°.

26. The method of claim 25, wherein the angle between the plume and the substrate is in the range of from about 50° to about 65°.

27. A method of depositing a biaxially aligned superconductor on a non-biaxially aligned substrate substantially chemically inert to the biaxially aligned superconductor comprising: forming a plume of a member of the $MGB_2$ family of superconductors providing a non-biaxially aligned substrate chemically inert to the superconductor, and contacting the plume and the non-biaxially aligned substrate at an angle greater than 0° and less than 90° to deposit a biaxially aligned member of the $MGB_2$ family of superconductors on the non-biaxially aligned substrate.

* * * * *